United States Patent
West et al.

(10) Patent No.: US 8,912,076 B2
(45) Date of Patent: Dec. 16, 2014

(54) CRACK DEFLECTOR STRUCTURE FOR IMPROVING SEMICONDUCTOR DEVICE ROBUSTNESS AGAINST SAW-INDUCED DAMAGE

(75) Inventors: Jeffrey Alan West, Dallas, TX (US); Thomas D. Bonifield, Dallas, TX (US); Basab Chatterjee, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 815 days.

(21) Appl. No.: 12/613,175

(22) Filed: Nov. 5, 2009

(65) Prior Publication Data

US 2010/0109128 A1    May 6, 2010

Related U.S. Application Data

(60) Provisional application No. 61/111,393, filed on Nov. 5, 2008.

(51) Int. Cl.
*H01L 23/58* (2006.01)
*H01L 23/00* (2006.01)

(52) U.S. Cl.
CPC ............ *H01L 23/585* (2013.01); *H01L 23/562* (2013.01); *H01L 2924/0002* (2013.01)
USPC .... 438/462; 257/620; 257/700; 257/E23.145; 257/E23.194

(58) Field of Classification Search
CPC ............................ H01L 23/562; H01L 23/585
USPC .......... 257/620, 698, 773, 774, E23.194, 700, 257/E23.011, E23.145; 438/462, 618, 622, 438/669, 672
See application file for complete search history.

(56) References Cited

U.S. PATENT DOCUMENTS

| | | | | |
|---|---|---|---|---|
| 6,075,280 A | * | 6/2000 | Yung et al. | 257/620 |
| 6,521,975 B1 | * | 2/2003 | West et al. | 257/620 |
| 7,812,424 B2 | * | 10/2010 | Barth et al. | 257/532 |
| 2006/0220250 A1 | * | 10/2006 | Kim et al. | 257/758 |

OTHER PUBLICATIONS

U.S. Appl. No. 12/365,333, filed Feb. 4, 2009 by West et al.

\* cited by examiner

*Primary Examiner* — Ha Tran T Nguyen
*Assistant Examiner* — Suberr Chi
(74) *Attorney, Agent, or Firm* — Jacqueline J. Garner; Frederick J. Telecky, Jr.

(57) ABSTRACT

An integrated circuit containing a crack deflecting scribe seal which separates an interior region of the integrated circuit from a scribeline immediately outside the integrated circuit and a method of forming the same. The crack deflecting scribe seal includes continuous metal layers and continuous contacts and continuous vias between the continuous metal layers. The continuous metal layers do not extend past the continuous contacts and continuous vias. The continuous contacts and continuous vias are recessed from edges of the underlying continuous metal layers on the scribeline side of the scribe seal, providing an angled outer surface on the scribe seal which may desirably terminate crack propagation or deflect crack propagation upward to a top surface of the scribeline or the crack deflecting scribe seal.

12 Claims, 9 Drawing Sheets

CRACK DEFLECTOR STRUCTURE FOR IMPROVING SEMICONDUCTOR DEVICE ROBUSTNESS AGAINST SAW-INDUCED DAMAGE

FIELD OF THE INVENTION

This invention relates to the field of integrated circuits. More particularly, this invention relates to scribe seals in integrated circuits.

BACKGROUND OF THE INVENTION

Integrated circuits (ICs) are commonly fabricated on wafers of semiconductor substrates; each wafer may contain hundreds to thousands of ICs, separated from each other by spaces known as scribelines or saw streets. Individual ICs are separated from neighboring ICs by processes which cut or break through the scribelines, such as wafer sawing, laser ablation scribing or damage creating laser scribing. These separation processes introduce mechanical defects at edges of the ICs which can generate cracks in the dielectric layers at the die periphery that can propagate through the dielectric layers towards the IC. Crack propagation is worse in dielectric layers under tensile stress, as commonly found in low-k dielectrics. Scribe seals provide some resistance to crack propagation into ICs, but may not be completely effective at terminating cracks.

SUMMARY OF THE INVENTION

The instant invention provides an integrated circuit containing a crack deflecting scribe seal which separates an interior region of the integrated circuit from a scribeline immediately outside the integrated circuit and a method of forming the same. The crack deflecting scribe seal includes continuous metal layers and continuous contacts and continuous vias between the continuous metal layers. The continuous metal layers do not extend past the continuous contacts and continuous vias. The continuous contacts and continuous vias are recessed from edges of the underlying continuous metal layers on the scribeline side of the scribe seal, providing an angled outer surface on the scribe seal which may desirably terminate crack propagation or deflect crack propagation upward to a top surface of the scribeline or the crack deflecting scribe seal.

DETAILED DESCRIPTION

Figure 1A:
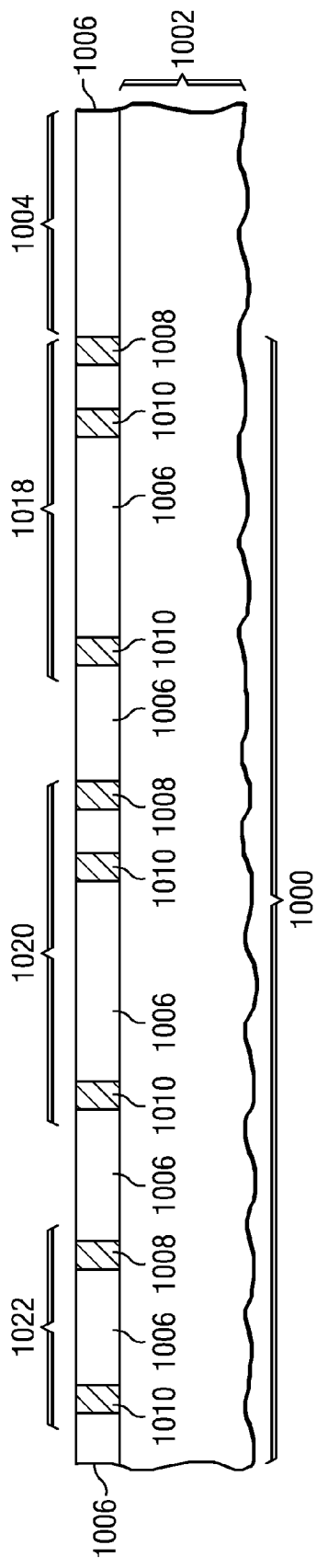
FIG. 1A through FIG. 1E are views of an integrated circuit containing a crack deflecting scribe seal formed according to the instant invention using a dual damascene copper process, depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

For the purposes of this disclosure, the terms "scribeline" and "scribeline region" are understood to refer to substrate material of a semiconductor wafer and material formed on the wafer, between integrated circuits. Scribelines are commonly 40 to 300 microns wide on wafers containing commercially available integrated circuits.

For the purposes of this disclosure, the term "low-k dielectric" refers to a dielectric material with a dielectric constant less than 3.2. Low-k dielectrics include organo-silicate glass (OSG), carbon-doped silicon oxides (SiCO or CDO) and dielectrics formed from methylsilsesquioxane (MSQ).

The instant invention provides an integrated circuit containing a crack deflecting scribe seal surrounding an interior region of the integrated circuit. The crack deflecting scribe seal includes a crack deflecting structure, which further includes a continuous metal line of each horizontal metal interconnect layer in the integrated circuit. Continuous contacts and continuous vias of each vertical interconnect layer in the integrated circuit are formed between the continuous metal lines so that an unbroken metal structure extends in the crack deflecting structure from a top surface of a semiconductor substrate containing the integrated circuit upward, preferably to a protective overcoat layer on a top surface of the integrated circuit. The continuous metal lines do not overhang the underlying continuous contacts or continuous vias on an exterior surface of the crack deflecting structure, that is, on a vertical surface of the crack deflecting structure facing the scribeline. At least half of the continuous vias are recessed from edges of the underlying continuous metal layers on the exterior surface of the crack deflecting structure, providing an angled exterior surface on the crack deflecting structure. During separation of the integrated circuit from the wafer, damage introduced in the scribeline by a separation process may initiate cracks which propagate toward the scribe seal. The angled exterior surface and absence of metal layer overhang over the continuous vias may desirably deflect crack propagation upward to a top surface of the scribeline.

The crack deflecting structure may include extensions of the metal layers behind the angled outer surface and additional contacts and vias supporting the metal layers extensions, to provide more mechanical strength to the angled exterior surface. Additional instances of the crack deflecting structure may be placed behind the first instance to increase resistance to crack propagation into the interior region of the integrated circuit. The crack deflecting structure may be combined with other sealing structures to provide additional protection from diffusion of chemical impurities into the interior region of the integrated circuit from the scribeline.

The crack deflecting scribe seal may be formed using dual damascene copper metallization, single damascene copper metallization and aluminum metallization. The crack deflecting scribe seal may provide additional resistance to crack propagation compared to conventional scribe seals during separation processes including wafer sawing, ablation laser scribing and damage creating laser scribing. Processes of forming integrated circuits containing the crack deflecting scribe seal and processes of separating integrated circuits containing the crack deflecting scribe seal are also disclosed.

The crack deflecting scribe seal may be formed in integrated circuits without adding process cost or complexity.

FIG. 1A through FIG. 1D are cross-sections of an integrated circuit containing a crack deflecting scribe seal formed according to the instant invention using a dual damascene copper process, depicted in successive stages of fabrication. Referring to FIG. 1A, the integrated circuit 1000 is formed on a semiconductor substrate 1002, such as a silicon wafer. The semiconductor substrate 1002 extends into a scribeline region 1004 which is adjacent to an area defined for the integrated circuit 1000. A pre-metal dielectric (PMD) layer 1006 is formed on an existing top surface of the semiconductor substrate 1002. The PMD layer 1006 is a dielectric layer stack typically including a PMD liner, a main PMD layer, and an optional PMD cap layer. The PMD layer 1006 is commonly 200 to 1000 nanometers thick.

Continuous contacts 1008 are formed in the PMD layer 1006 as part of the crack deflecting scribe seal. The continuous contacts 1008 are preferably formed concurrently with other contacts (not shown) in the integrated circuit 1000. Contacts are commonly formed by defining contact areas on a top surface of the PMD layer 1006 with a contact photoresist pattern (not shown), etching contact holes in the contact areas by removing PMD layer material using etching methods such as reactive ion etching (RIE) to expose the top surface of the semiconductor substrate 1002, and filling the contact holes with a contact liner metal, such as titanium, and a contact fill metal, typically tungsten, followed by removal of the contact fill metal from the top surface of the PMD layer 1006 using etching and/or chemical mechanical polishing (CMP) methods.

One of the continuous contacts 1008 is formed in a first crack deflecting structure 1018 at a perimeter of the integrated circuit 1000 adjacent to the scribeline region 1004. Another of the continuous contacts 1008 may be formed in an optional second crack deflecting structure 1020, behind the first crack deflecting structure 1018. Yet another of the continuous contacts 1008 is formed in an optional chemical impurity barrier structure 1022 behind the first crack deflecting structure 1018. Optional secondary contacts 1010, which may be continuous, may be formed in the first crack deflecting structure 1018, the optional second crack deflecting structure 1020 if present, and the optional chemical impurity barrier structure 1022 if present, to provide additional mechanical strength to the crack deflecting scribe seal. The continuous contacts 1008 extend in and out of the plane of FIG. 1A to form a continuous seal with the semiconductor substrate 1002 at a perimeter of the integrated circuit 1000.

Figure 1B:
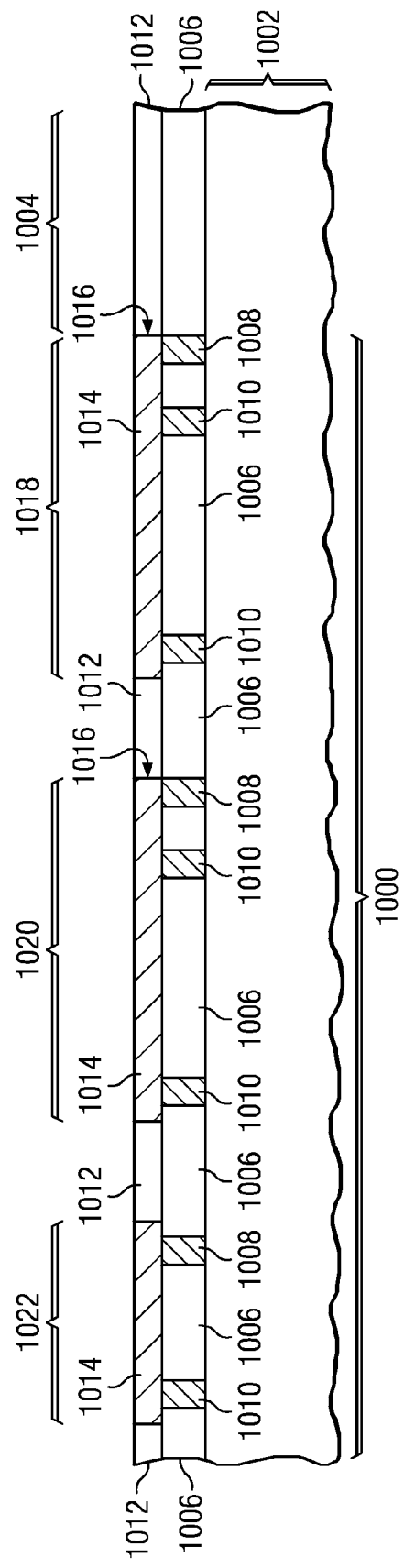

FIG. 1B depicts the integrated circuit 1000 after formation of a first level of metal interconnects in the crack deflecting scribe seal. A first intra-metal dielectric (IMD) layer 1012 is formed on a top surface of the PMD layer 1006. The first IMD layer 1012 typically includes a low-k dielectric, and is commonly 80 to 300 nanometers thick. Continuous first metal lines 1014 are formed in the first IMD layer 1012, connecting to tops of the continuous contacts 1008 and optional secondary contacts 1010 if present. The continuous first metal lines 1014 are formed by etching first metal trenches in the first IMD layer 1012 to expose the tops of the continuous contacts 1008. A first layer of liner metal such as tantalum nitride is deposited in the first metal trenches and on a top surface of the first IMD layer 1012. A first layer of copper is formed on a top surface of the first liner metal, for example by sputtering a seed layer of copper followed by electroplating copper, such that copper fills the first metal trenches. Copper and liner metal are removed from the top surface of the first IMD layer 1012, typically by CMP processes. The continuous first metal lines 1014 are preferably formed concurrently with other first metal interconnects (not shown) in the integrated circuit 1000.

One of the continuous first metal lines 1014 is formed in the first crack deflecting structure 1018 at a perimeter of the integrated circuit 1000 adjacent to the scribeline region 1004. Another of the continuous first metal lines 1014 is formed in the optional second crack deflecting structure 1020, if present. Edges of the continuous first metal lines 1014 do not overhang, and are preferably substantially coincident with, edges of the continuous contacts 1008 in the first crack deflecting structure 1018 and in the optional second crack deflecting structure 1020, if present, on exterior surfaces 1016. Yet another of the continuous first metal lines 1014 is formed in the optional chemical impurity barrier structure 1022, if present. The continuous first metal lines 1014 extend in and out of the plane of FIG. 1B to form a continuous seal with the continuous contacts 1008.

Figure 1C:
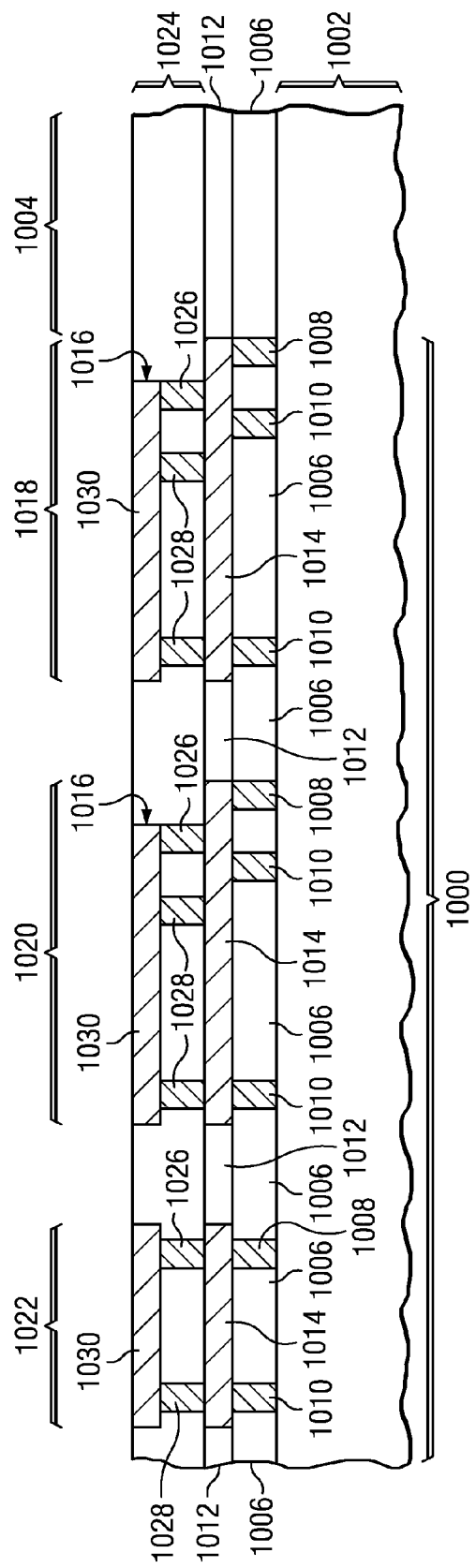

FIG. 1C depicts the integrated circuit 1000 after formation of a second level of metal interconnects in the crack deflecting scribe seal. A first inter-level dielectric (ILD) layer 1024 is formed on the top surface of the first IMD layer 1012 and top surfaces of the continuous first metal lines 1014. The first ILD layer 1024 typically includes a low-k dielectric, and is commonly 150 to 400 nanometers thick.

Continuous first vias 1026 and optional secondary first vias 1028, which may be continuous, and continuous second metal lines 1030 are formed in the first ILD layer 1024 using the dual damascene process. The continuous first vias 1026 and optional secondary first vias 1028 if present connect to the continuous first metal lines 1014. The continuous second metal lines 1030 connect to the continuous first vias 1026 and optional secondary first vias 1028 if present. Trenches for the continuous first vias 1026 and optional secondary first vias 1028 are etched in the first ILD layer 1024 using RIE processes. Trenches for the continuous second metal lines 1030, overlapping the trenches for the continuous first vias 1026 and optional secondary first vias 1028 are etched in the first ILD layer 1024 using RIE processes. Edges of the continuous second metal trenches do not overhang, and are preferably substantially coincident with, edges of the continuous first via trenches in the first crack deflecting structure 1018 and in the optional second crack deflecting structure 1020, if present, on exterior surfaces. A second layer of liner metal is deposited in the continuous second metal trenches and the continuous first via trenches, as described in reference to FIG. 1B. A second layer of copper is formed on a top surface of the second liner metal layer, as described in reference to FIG. 1B. Copper and liner metal are removed from the top surface of the first ILD layer 1024, as described in reference to FIG. 1B. The continuous first vias 1026, optional secondary first vias 1028 and continuous second metal lines 1030 are preferably formed concurrently with other first vias and second metal interconnects (not shown) in the integrated circuit 1000. Copper in the continuous first vias 1026 and optional secondary first vias 1028 directly contacts copper in the continuous second metal lines 1030, as is characteristic of a dual damascene copper process. The continuous first vias 1026 and continuous second metal lines 1030 extend in and out of the plane of FIG. 1C to form a continuous seal with the continuous first metal lines 1014. The optional secondary first vias 1028, if present, may provide additional mechanical strength to the crack deflecting scribe seal.

Figure 1D:
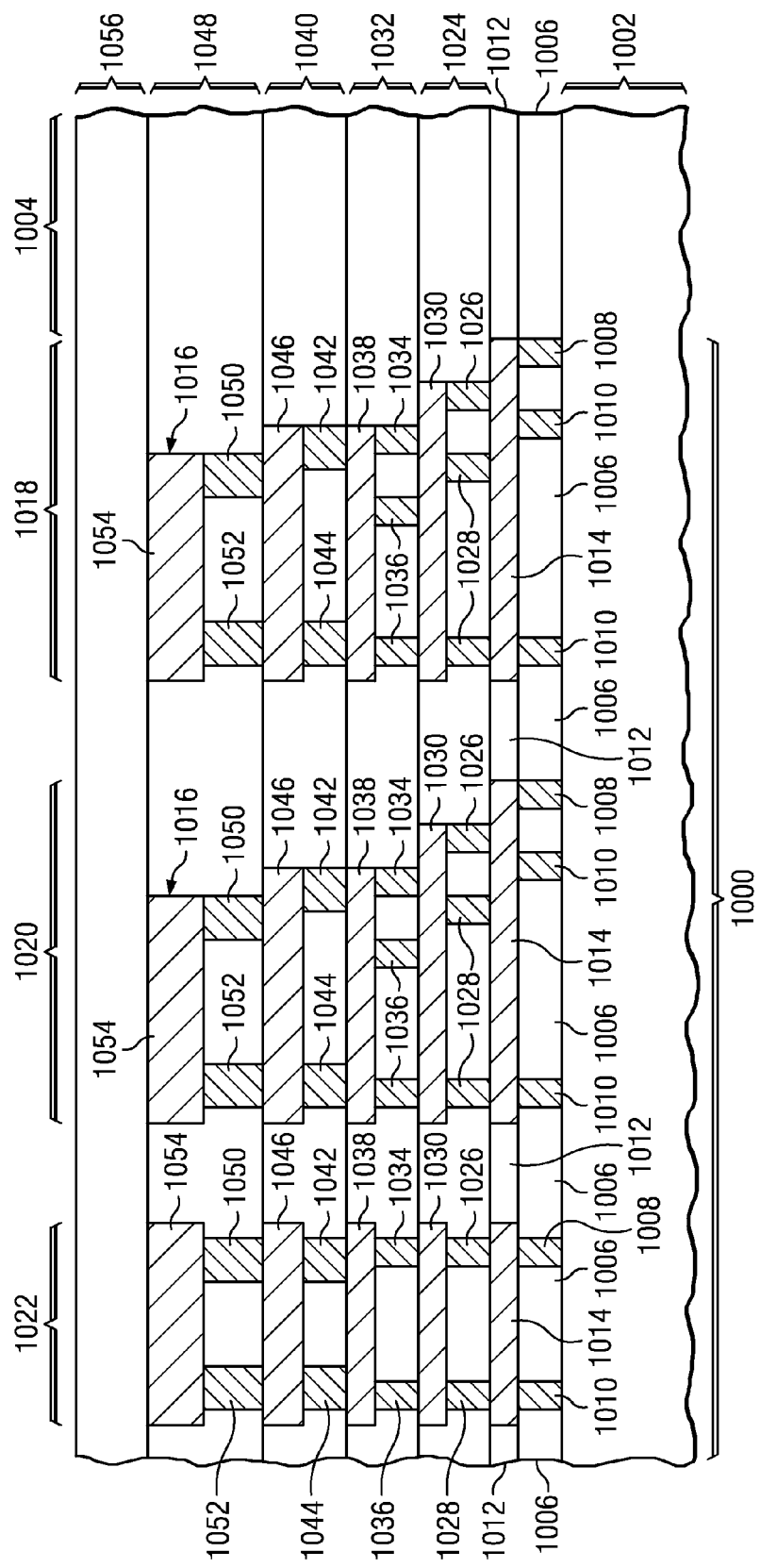

FIG. 1D depicts the integrated circuit 1000 after formation of the crack deflecting scribe seal. A second ILD layer 1032, typically containing a low-k dielectric, is formed on the top surface of the first ILD layer 1024 and top surfaces of the continuous second metal lines 1030, as described in reference to FIG. 1C. Continuous second vias 1034, optional secondary second vias 1036, which may be continuous, and continuous third metal lines 1038 are formed in the second ILD layer 1032 using a dual damascene process, as described in reference to FIG. 1C. Edges of the continuous third metal lines 1038 do not overhang, and are preferably substantially coincident with, edges of the continuous second vias 1034 in the first crack deflecting structure 1018 and in the optional second crack deflecting structure 1020, if present, on exterior surfaces. The continuous second vias 1034, optional secondary second vias 1036 and continuous third metal lines 1038 are preferably formed concurrently with other second vias and third metal interconnects (not shown) in the integrated circuit 1000. Copper in the continuous second vias 1034 and optional secondary second vias 1036 directly contacts copper in the continuous third metal lines 1038, as is characteristic of a dual damascene copper process. The continuous second vias 1034 and continuous third metal lines 1038 extend in and out of the plane of FIG. 1D to form a continuous seal with the continuous second metal lines 1030. The optional secondary second vias 1036, if present, may provide additional mechanical strength to the crack deflecting scribe seal.

A third ILD layer 1040, possibly containing a low-k dielectric, is formed on the top surface of the second ILD layer 1032 and top surfaces of the continuous third metal lines 1038, as described in reference to FIG. 1C. Continuous third vias 1042, optional secondary third vias 1044 which may be continuous, and continuous fourth metal lines 1046 are formed in the third ILD layer 1040 using a dual damascene process, as described in reference to FIG. 1C. Edges of the continuous fourth metal lines 1046 do not overhang, and are preferably substantially coincident with, edges of the continuous third vias 1042 in the first crack deflecting structure 1018 and in the optional second crack deflecting structure 1020, if present, on exterior surfaces. The continuous third vias 1042 and continuous fourth metal lines 1046 are preferably formed concurrently with other third vias and fourth metal interconnects (not shown) in the integrated circuit 1000. The continuous third vias 1042 and continuous fourth metal lines 1046 extend in and out of the plane of FIG. 1D to form a continuous seal with the continuous third metal lines 1038. The optional secondary third vias 1044, if present, may provide additional mechanical strength to the crack deflecting scribe seal.

A fourth ILD layer 1048, possibly containing a low-k dielectric, is formed on the top surface of the third ILD layer 1040 and top surfaces of the continuous fourth metal lines 1046, as described in reference to FIG. 1C. Continuous fourth vias 1050, optional secondary fourth vias 1052 which may be continuous, and continuous fifth metal lines 1054 are formed in the fourth ILD layer 1048 using a dual damascene process, as described in reference to FIG. 1C. Edges of the continuous fifth metal lines 1054 do not overhang, and are preferably substantially coincident with, edges of the continuous fourth vias 1050 in the first crack deflecting structure 1018 and in the optional second crack deflecting structure 1020, if present, on exterior surfaces. The continuous fourth vias 1050 and continuous fifth metal lines 1054 are preferably formed concurrently with other fourth vias and fifth metal interconnects (not shown) in the integrated circuit 1000. The continuous fourth vias 1050 and continuous fifth metal lines 1054 extend in and out of the plane of FIG. 1D to form a continuous seal with the continuous fourth metal lines 1046. The optional secondary fourth vias 1052, if present, may provide additional mechanical strength to the crack deflecting scribe seal.

At least half, and preferably all, of the continuous vias 1026, 1034, 1042, 1050 on exterior surfaces in the first crack deflecting structure 1018 and in the optional second crack deflecting structure 1020, if present, are recessed from edges of the underlying continuous metal lines 1014, 1030, 1038, 1046, as depicted in FIG. 1D. Recessed continuous vias may advantageously deflect crack propagation upward to a top surface of the scribeline region 1004 or a top surface of the integrated circuit 1000 over the first crack deflecting structure 1018.

It is within the scope of the instant invention for the first crack deflecting structure 1018 and the second crack deflecting structure 1020, if present, to include more, or fewer, continuous metal lines and continuous vias, in each metallization level, configured as described in reference to FIG. 1D.

An optional top dielectric layer 1056, possibly containing nitrogen and referred to as a protective overcoat, may be formed on an existing top surface of the integrated circuit 1000. In a preferred embodiment, the first crack deflecting structure 1018, the optional second crack deflecting structure 1020, if present, and the optional chemical impurity barrier structure 1022, if present, extend from the semiconductor substrate 1002 to the optional top dielectric layer 1056, if present.

It is within the scope of the instant invention to include additional crack deflecting structures in the integrated circuit 1000. It is furthermore within the scope of the instant invention to include additional chemical impurity barrier structures in the integrated circuit 1000.

It is within the scope of the instant invention for the first crack deflecting structure 1018 and the second crack deflecting structure 1020, if present, to include continuous vias and continuous metal lines formed in more, or fewer, metallization levels than depicted in FIG. 1D, such that each continuous metal line does not overhang an immediately underlying continuous via at the exterior surface, and such that at least half of the continuous vias are recessed from immediately underlying continuous metal lines at the exterior surface.

Figure 1E:
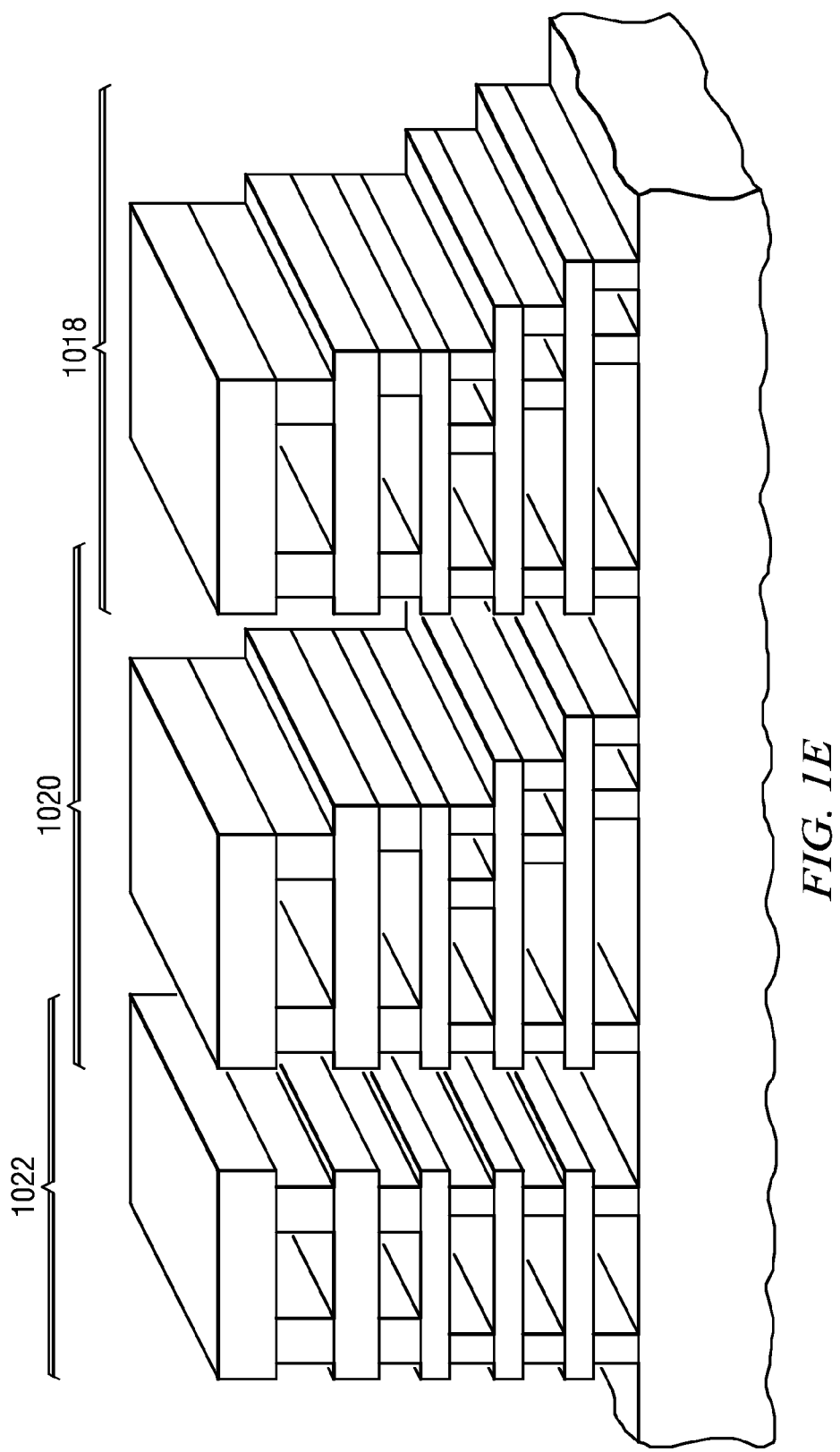

FIG. 1E is a cutaway perspective of the integrated circuit depicted in FIG. 1D, with dielectric material removed, showing the continuous nature of elements of the first crack deflecting structure 1018, the optional second crack deflecting structure 1020, and the optional chemical impurity barrier structure 1022.

Figure 2A:
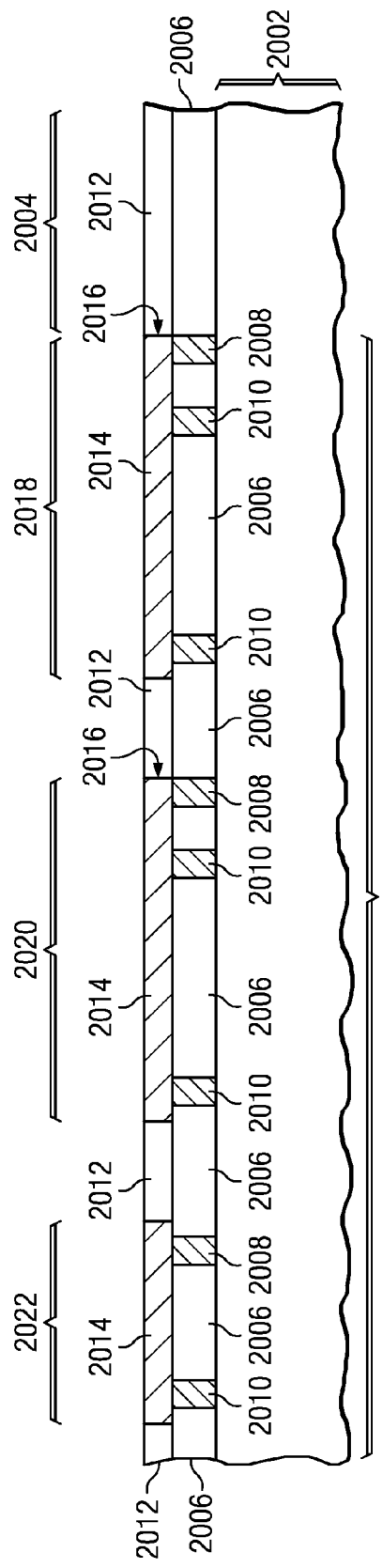
FIG. 2A through FIG. 2C are cross-sections of an integrated circuit containing a crack deflecting scribe seal formed according to an alternate embodiment of the instant invention, depicted in successive stages of fabrication.
Figure 2B:
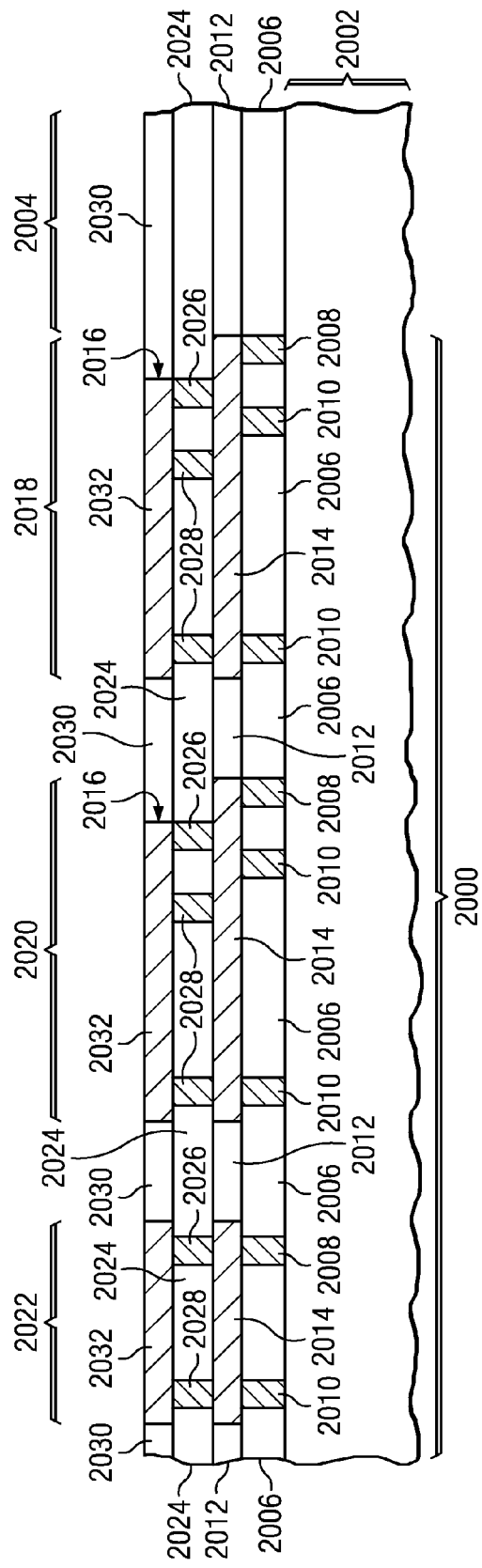
Figure 2C:
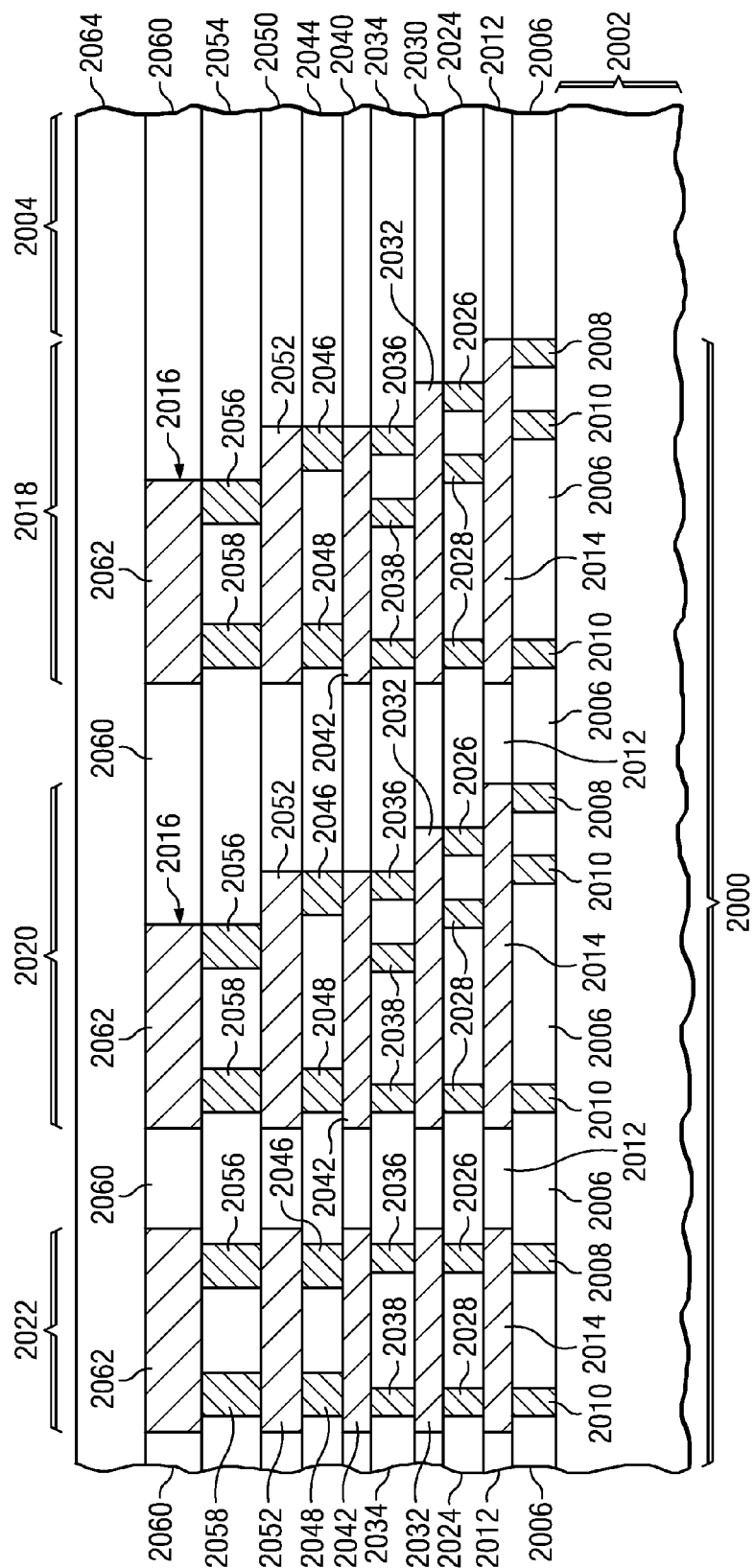

FIG. 2A through FIG. 2C are cross-sections of an integrated circuit containing a crack deflecting scribe seal formed according to an alternate embodiment of the instant invention, depicted in successive stages of fabrication. Referring to FIG. 2A, the integrated circuit 2000 is formed on a semiconductor substrate 2002, such as a silicon wafer. The semiconductor substrate 2002 extends into a scribeline region 2004 which is adjacent to the integrated circuit 2000. A pre-metal dielectric (PMD) layer 2006 is formed on an existing top surface of the semiconductor substrate 2002 as described in reference to FIG. 1A. Continuous contacts 2008 and optional secondary contacts 2010, which may be continuous, are formed in the PMD layer 2006, as described in reference to FIG. 1A, as part of the crack deflecting scribe seal. The continuous contacts 2008 and optional secondary contacts 2010 are preferably formed concurrently with other contacts (not shown) in the integrated circuit 2000. One of the continuous contacts 2008 is formed in a first crack deflecting structure 2018 at a perimeter of the integrated circuit 2000 adjacent to the scribeline region 2004. Another of the continuous contacts 2008 may be formed in an optional second crack deflecting structure 2020, behind the first crack deflecting structure 2018. Yet another of the continuous contacts 2008 is formed in an optional chemical impurity barrier structure 2022 behind the first crack deflecting structure 2018. The continuous contacts 2008 extend in and out of the plane of FIG. 2A to form a continuous seal with the semiconductor substrate 2002 at a perimeter of the integrated circuit 2000.

A first IMD layer 2012 and continuous first metal lines 2014 are formed on a top surface of the PMD layer 2006. In a single damascene copper process embodiment, the first IMD layer 2012 is formed and first metal trenches for the continuous first metal lines 2014 are subsequently etched in the first IMD layer 2012, exposing top surfaces of the continuous contacts 2008 and optional secondary contacts 2010 if present, as described in reference to FIG. 1B. The first metal trenches are filled with a liner metal and copper, as described in reference to FIG. 1B.

In an aluminum metallization process embodiment, a first layer of aluminum is deposited on the top surface of the PMD layer 2006. A first metal photoresist pattern (not shown) is formed on a top surface of the first layer of aluminum to define areas for the continuous first metal lines 2014. Unwanted material in the first layer of aluminum is removed by an RIE process thereby leaving the continuous first metal lines 2014 on the top surface of the PMD layer 2006, connecting to the exposing top surfaces of the continuous contacts 2008 and optional secondary contacts 2010 if present. The first metal photoresist pattern is subsequently removed, and the first IMD layer 2012, typically including a low-k dielectric, is formed on the top surface of the PMD layer 2006 between the continuous first metal lines 2014.

The continuous first metal lines 2014 are preferably formed concurrently with other first metal interconnects (not shown) in the integrated circuit 2000. One of the continuous first metal lines 2014 is formed in the first crack deflecting structure 2018 at a perimeter of the integrated circuit 2000 adjacent to the scribeline region 2004. Another of the continuous first metal lines 2014 is formed in the optional second crack deflecting structure 2020, if present. Edges of the continuous first metal lines 2014 do not overhang, and are preferably substantially coincident with, edges of the continuous contacts 2008 in the first crack deflecting structure 2018 and in the optional second crack deflecting structure 2020, if present, on exterior surfaces 2016. Yet another of the continuous first metal lines 2014 is formed in the optional chemical impurity barrier structure 2022, if present. The continuous first metal lines 2014 extend in and out of the plane of FIG. 2A to form a continuous seal with the continuous contacts 2008.

FIG. 2B depicts the integrated circuit 2000 after formation of a second level of metal interconnects in the crack deflecting scribe seal. A first ILD layer 2024, continuous first vias 2026, optional secondary first vias 2028, a second IMD layer 2030 and continuous second metal lines 2032 are formed on a top surface of the first IMD layer 2012. In the single damascene copper process embodiment, the first ILD layer 2024, typically including a low-k dielectric, and commonly 100 to 300 nanometers thick, is formed on the top surface of the first IMD layer 2012. First via trenches for the continuous first vias 2026 and optional secondary first vias 2028, if formed, are subsequently etched in the first ILD layer 2024 using an RIE process, exposing top surfaces of the continuous first metal lines 2014. A first via layer of liner metal, such as tantalum nitride, is conformally deposited in the first via trenches and on a top surface of the first ILD layer 2024. A first via layer of copper is formed on a top surface of the first via liner metal, for example by sputtering a seed layer of copper followed by electroplating copper, such that copper fills the first via trenches. Copper and liner metal are removed from the top surface of the first ILD layer 2024, typically by CMP processes.

Continuing with the single damascene copper process embodiment, the second IMD layer 2030, typically including a low-k dielectric, and commonly between 50 and 150 nanometers thick, is formed on top surfaces of the first ILD layer 2024 and continuous first vias 2026. Second metal trenches for the continuous second metal lines 2032 are subsequently etched in the second IMD layer 2030, exposing top surfaces of the continuous first vias 2026 and optional secondary first vias 2028 if present. A second metal layer of liner metal, such as tantalum nitride, is conformally deposited in the second metal trenches and on a top surface of the second IMD layer 2030. A second metal layer of copper is formed on a top surface of the second metal liner metal, for example by sputtering a seed layer of copper followed by electroplating copper, such that copper fills the second metal trenches. Copper and liner metal are removed from the top surface of the second IMD layer 2030, typically by CMP processes, as described in reference to FIG. 1B. Copper in the continuous first vias 2026 and optional secondary first vias 2028 is separated from copper in the continuous second metal lines 2032 by the second metal liner metal, as is characteristic of a single damascene copper process.

In the aluminum metallization process embodiment, the first ILD layer 2024, typically including a low-k dielectric, and commonly 100 to 300 nanometers thick, is formed on the top surface of the first IMD layer 2012. First via trenches for the continuous first vias 2026 and optional secondary first vias 2028, if formed, are subsequently etched in the first ILD layer 2024 using an RIE process, exposing top surfaces of the continuous first metal lines 2014. First via metal, such as tungsten, is deposited in the first via trenches and on a top surface of the first ILD layer 2024 so that the first via trenches are filled with metal. First via metal is removed from the top surface of the first ILD layer 2024 by etching and/or CMP processes, leaving the continuous first vias 2026 and optional secondary first vias 2028, if formed, in the first ILD layer 2024.

Continuing with the aluminum metallization process embodiment, the continuous second metal lines 2032 are formed of aluminum on the top surface of the first ILD layer 2024 by a similar process used to form the aluminum continuous first metal lines 2014 as described in the aluminum metallization process embodiment in reference to FIG. 2A. The continuous second metal lines 2032 make contact to top surfaces of the continuous first vias 2026 and optional secondary first vias 2028, if present. The second IMD layer 2030 is formed on the top surface of the first ILD layer 2024 between the continuous second metal lines 2032.

In both the single damascene copper process embodiment and the aluminum metallization process embodiment, the continuous first vias 2026, optional secondary first vias 2028, if present, and continuous second metal lines 2032 are preferably formed concurrently with other first vias (not shown) and other second metal lines (not shown) in the integrated circuit 2000. One of the continuous second metal lines 2032 is formed in the first crack deflecting structure 2018 adjacent to the scribeline region 2004. Another of the continuous second metal lines 2032 is formed in the optional second crack deflecting structure 2020, if present. Edges of the continuous second metal lines 2032 do not overhang, and are preferably substantially coincident with, edges of the continuous first vias 2026 in the first crack deflecting structure 2018 and in the optional second crack deflecting structure 2020, if present, on exterior surfaces 2016. Yet another of the continuous second metal lines 2032 is formed in the optional chemical impurity barrier structure 2022, if present. In both the single damascene copper process embodiment and the aluminum metallization process embodiment, the continuous first vias 2026 and continuous second metal lines 2032 extend in and out of the plane of FIG. 2B to form a continuous seal with the continuous first metal lines 2014. The optional secondary first vias 2028, if present, may provide additional mechanical strength to the crack deflecting scribe seal.

FIG. 2C depicts the integrated circuit 2000 after formation of the crack deflecting scribe seal. In the single damascene copper process embodiment, a second ILD layer 2034, typically containing a low-k dielectric, is formed on the top surface of the second IMD layer 2030 and top surfaces of the continuous second metal lines 2032, as described in reference to FIG. 2B. Continuous second vias 2036 and optional secondary second vias 2038 are formed of a liner metal and copper in the second ILD layer 2034 using a single damascene process, as described in reference to FIG. 2B. The continuous second vias 2036 and optional secondary second vias 2038, if formed, connect to the top surfaces of the continuous second metal lines 2032. A third IMD layer 2040 is formed on a top surface of the second ILD layer 2034, as described in the single damascene copper process embodiment in reference to FIG. 2A. Continuous third metal lines 2042 are formed of liner metal and copper in the third IMD layer 2040, as described in reference to FIG. 2A. Copper in the continuous second vias 2036 and optional secondary second vias 2038 is separated from copper in the continuous third metal lines 2042 by a third metal liner metal, as is characteristic of a single damascene copper process.

In the aluminum metallization process embodiment, the second ILD layer 2034 is formed on the top surface of the second IMD layer 2030 and top surfaces of the continuous second metal lines 2032, as described in the aluminum metallization process embodiment in reference to FIG. 2B. Continuous second vias 2036 and optional secondary second vias 2038 are formed of a second via metal such as tungsten in the second IMD layer 2030, as described in the aluminum metallization process embodiment in reference to FIG. 2B. Continuous third metal lines 2042 are formed of aluminum on the top surface of the second ILD layer 2034 by a similar process used to form the aluminum continuous first metal lines 2014 as described in the aluminum metallization process embodiment in reference to FIG. 2A. The third IMD layer 2040 is formed on the top surface of the second ILD layer 2034 between the continuous third metal lines 2042.

The continuous third metal lines 2042 connect to top surfaces of the continuous second vias 2036 and optional secondary second vias 2038, if formed. In both the single damascene copper process embodiment and the aluminum metallization process embodiment, the continuous second vias 2036, optional secondary second vias 2038, if formed, and continuous third metal lines 2042 are preferably formed concurrently with other second vias (not shown) and other third metal lines (not shown) in the integrated circuit 2000. One of the continuous third metal lines 2042 is formed in the first crack deflecting structure 2018 adjacent to the scribeline region 2004. Another of the continuous third metal lines 2042 is formed in an optional second crack deflecting structure 2020, if present. Edges of the continuous third metal lines 2042 do not overhang, and are preferably substantially coincident with, edges of the continuous second vias 2036 in the first crack deflecting structure 2018 and in the optional second crack deflecting structure 2020, if present, on exterior surfaces 2016. Yet another of the continuous third metal lines 2042 is formed in the optional chemical impurity barrier structure 2022, if present. In both the single damascene copper process embodiment and the aluminum metallization process embodiment, the continuous second vias 2036 and continuous third metal lines 2042 extend in and out of the plane of FIG. 2B to form a continuous seal with the continuous second metal lines 2032. The optional secondary second vias 2038, if present, may provide additional mechanical strength to the crack deflecting scribe seal.

In the single damascene copper process embodiment, a third ILD layer 2044, possibly containing a low-k dielectric, is formed on a top surface of the third IMD layer 2040 and top surfaces of the continuous third metal lines 2042, as described in reference to FIG. 2B. Continuous third vias 2046 and optional secondary third vias 2048 are formed of a liner metal and copper in the third ILD layer 2044 using a single damascene process, as described in reference to FIG. 2B. The continuous third vias 2046 and optional secondary third vias 2048, if present, connect to the top surfaces of the continuous third metal lines 2042. A fourth IMD layer 2050 is formed on a top surface of the third ILD layer 2044, as described in the single damascene copper process embodiment in reference to FIG. 2A. Continuous fourth metal lines 2052 are formed of liner metal and copper in the fourth IMD layer 2050, as described in reference to FIG. 2A.

In the aluminum metallization process embodiment, the third ILD layer 2044 is formed on the top surface of the third IMD layer 2040 and top surfaces of the continuous third metal lines 2042, as described in the aluminum metallization process embodiment in reference to FIG. 2B. Continuous third vias 2046 and optional secondary third vias 2048 are formed of a third via metal such as tungsten in the third IMD layer 2040, as described in the aluminum metallization process embodiment in reference to FIG. 2B. Continuous fourth metal lines 2052 are formed of aluminum on the top surface of the third ILD layer 2044 by a similar process used to form the aluminum continuous first metal lines 2014 as described in the aluminum metallization process embodiment in reference to FIG. 2A. The fourth IMD layer 2050 is formed on the top surface of the third ILD layer 2044 between the continuous fourth metal lines 2052.

The continuous fourth metal lines 2052 connect to top surfaces of the continuous third vias 2046 and optional secondary third vias 2048, if formed. In both the single damascene copper process embodiment and the aluminum metallization process embodiment, the continuous third vias 2046, optional secondary third vias 2048, if formed, and continuous fourth metal lines 2052 are preferably formed concurrently with other third vias (not shown) and other fourth metal lines (not shown) in the integrated circuit 2000. One of the continuous fourth metal lines 2052 is formed in the first crack deflecting structure 2018 adjacent to the scribeline region 2004. Another of the continuous fourth metal lines 2052 is formed in the optional second crack deflecting structure 2020, if present. Edges of the continuous fourth metal lines 2052 do not overhang, and are preferably substantially coincident with, edges of the continuous third vias 2046 in the first crack deflecting structure 2018 and in the optional second crack deflecting structure 2020, if present, on exterior surfaces 2016. Yet another of the continuous fourth metal lines 2052 is formed in the optional chemical impurity barrier structure 2022, if present. In both the single damascene copper process embodiment and the aluminum metallization process embodiment, the continuous third vias 2046 and continuous fourth metal lines 2052 extend in and out of the plane of FIG. 2B to form a continuous seal with the continuous third metal lines 2042. The optional secondary third vias 2048, if present, may provide additional mechanical strength to the crack deflecting scribe seal.

In the single damascene copper process embodiment, a fourth ILD layer 2054, possibly containing a low-k dielectric, is formed on a top surface of the fourth IMD layer 2050 and top surfaces of the continuous fourth metal lines 2052, as described in reference to FIG. 2B. Continuous fourth vias 2056 and optional secondary fourth vias 2058 are formed of a liner metal and copper in the fourth ILD layer 2054 using a single damascene process, as described in reference to FIG. 2B. The continuous fourth vias 2056 and optional secondary fourth vias 2058, if present, connect to the top surfaces of the continuous fourth metal lines 2052. A fifth IMD layer 2060 is formed on a top surface of the fourth ILD layer 2054, as described in the single damascene copper process embodiment in reference to FIG. 2A. Continuous fifth metal lines 2062 are formed of liner metal and copper in the fifth IMD layer 2060, as described in reference to FIG. 2A.

In the aluminum metallization process embodiment, the fourth ILD layer 2054 is formed on the top surface of the fourth IMD layer 2050 and top surfaces of the continuous fourth metal lines 2052, as described in the aluminum metallization process embodiment in reference to FIG. 2B. Continuous fourth vias 2056 and optional secondary fourth vias 2058 are formed of a fourth via metal such as tungsten in the fourth IMD layer 2050, as described in the aluminum metallization process embodiment in reference to FIG. 2B. Continuous fifth metal lines 2062 are formed of aluminum on the top surface of the fourth ILD layer 2054 by a similar process used to form the aluminum continuous first metal lines 2014 as described in the aluminum metallization process embodiment in reference to FIG. 2A. The fifth IMD layer 2060 is formed on the top surface of the fourth ILD layer 2054 between the continuous fifth metal lines 2062.

The continuous fifth metal lines 2062 connect to top surfaces of the continuous fourth vias 2056 and optional secondary fourth vias 2058, if formed. In both the single damascene copper process embodiment and the aluminum metallization process embodiment, the continuous fourth vias 2056, optional secondary fourth vias 2058, if formed, and continuous fifth metal lines 2062 are preferably formed concurrently with other fourth vias (not shown) and other fifth metal lines (not shown) in the integrated circuit 2000. One of the continuous fifth metal lines 2062 is formed in the first crack deflecting structure 2018 adjacent to the scribeline region 2004. Another of the continuous fifth metal lines 2062 is formed in the optional second crack deflecting structure 2020, if present. Edges of the continuous fifth metal lines 2062 do not overhang, and are preferably substantially coincident with, edges of the continuous fourth vias 2056 in the first crack deflecting structure 2018 and in the optional second crack deflecting structure 2020, if present, on exterior surfaces 2016. Yet another of the continuous fifth metal lines 2062 is formed in the optional chemical impurity barrier structure 2022, if present. In both the single damascene copper process embodiment and the aluminum metallization process embodiment, the continuous fourth vias 2056 and continuous fifth metal lines 2062 extend in and out of the plane of FIG. 2B to form a continuous seal with the continuous fourth metal lines 2052. The optional secondary fourth vias 2058, if present, may provide additional mechanical strength to the crack deflecting scribe seal.

At least half, and preferably all, of the continuous vias 2026, 2036, 2046, 2056 on exterior surfaces 2016 in the first crack deflecting structure 2018 and in the optional second crack deflecting structure 2020, if present, are recessed from edges of the underlying continuous metal lines 2014, 2032, 2042, 2052, as depicted in FIG. 2C. Recessed continuous vias may advantageously deflect crack propagation upward to a top surface of the scribeline region 2004 or a top surface of the integrated circuit 2000 over the first crack deflecting structure 2018.

An optional top dielectric layer 2064, possibly containing nitrogen and referred to as a protective overcoat, may be formed on an existing top surface of the integrated circuit 2000. In a preferred embodiment, the first crack deflecting structure 2018, the optional second crack deflecting structure 2020, if present, and the optional chemical impurity barrier structure 2022, if present, extend from the semiconductor substrate 2002 to the optional top dielectric layer 2064, if present.

The continuous metal lines 2014, 2032, 2042, 2052, 2062 in the first crack deflecting structure 2018 and optional second crack deflecting structure 2020 may be connected to additional continuous contacts and continuous vias behind the exterior surfaces 2016, as shown in FIG. 2C, so as to provide additional mechanical strength to the first crack deflecting structure 2018 and optional second crack deflecting structure 2020.

It is within the scope of the instant invention to include additional crack deflecting structures in the integrated circuit 2000. It is furthermore within the scope of the instant invention to include additional chemical impurity barrier structures in the integrated circuit 2000.

It is within the scope of the instant invention for the first crack deflecting structure 2018 and the second crack deflecting structure 2020, if present, to include continuous vias and continuous metal lines formed in more, or fewer, metallization levels than depicted in FIG. 2C, such that each continuous metal line does not overhang an immediately underlying continuous via at the exterior surface, and such that at least half of the continuous vias are recessed from immediately underlying continuous metal lines at the exterior surface.

Figure 3:
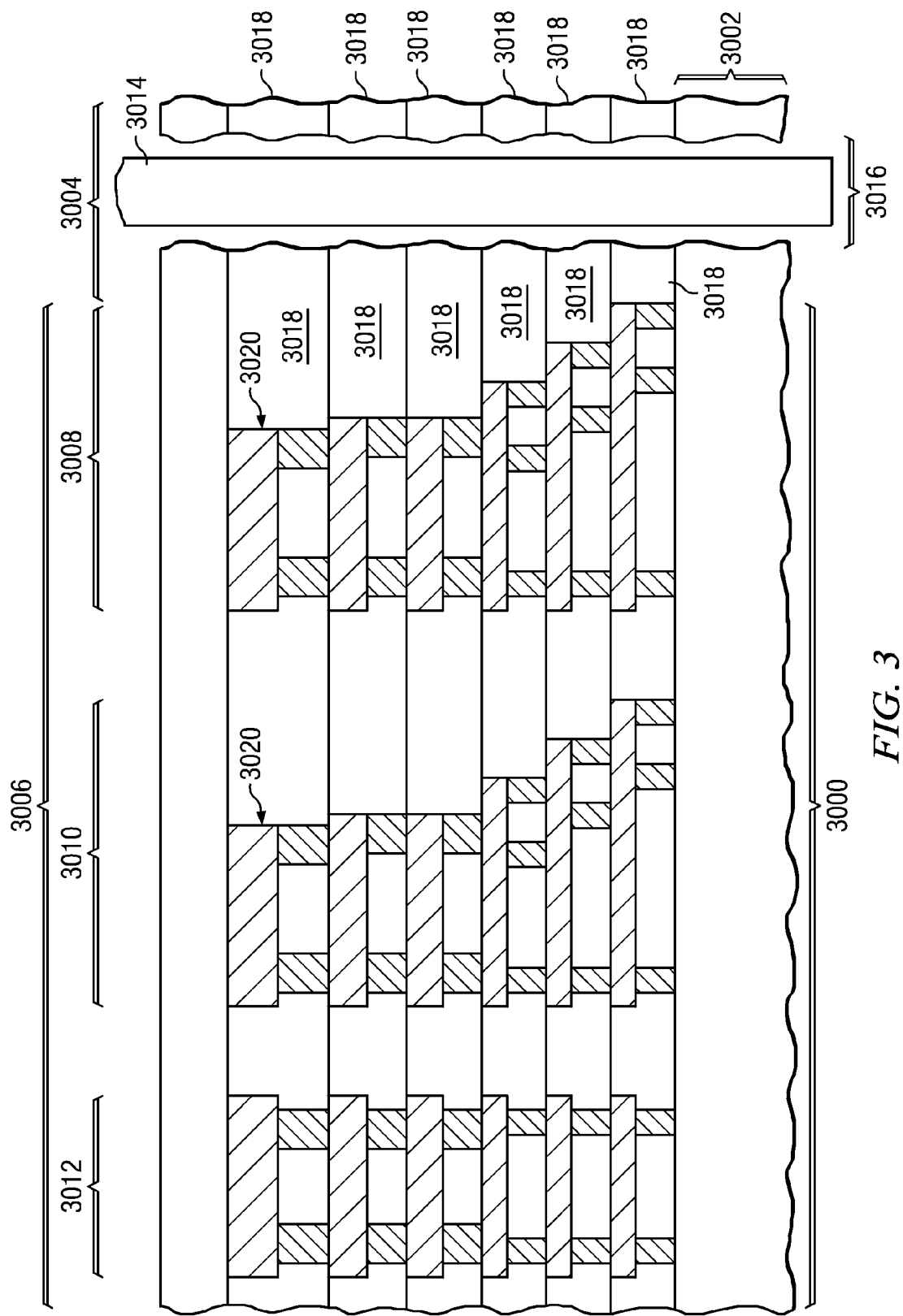
FIG. 3 depicts an integrated circuit formed according to an embodiment of the instant invention, during a wafer sawing operation.

FIG. 3 depicts an integrated circuit formed according to an embodiment of the instant invention, during a wafer sawing operation. The integrated circuit 3000 is formed on a substrate 3002 as described in reference to FIG. 1A. A scribeline region 3004 is adjacent to the integrated circuit 3000. A scribe seal 3006 includes a crack deflecting structure 3008, formed as described in reference to FIG. 1A through FIG. 1D or as described in reference to FIG. 2A through FIG. 2C. The scribe seal 3006 may include an optional second crack deflecting structure 3010, formed concurrently with the crack deflecting structure 3008, as described in reference to FIG. 1A through FIG. 1D or as described in reference to FIG. 2A through FIG. 2C. The scribe seal 3006 may further include an optional chemical impurity barrier structure 3012, also formed concurrently with the crack deflecting structure 3008, as described in reference to FIG. 1A through FIG. 1D or as described in reference to FIG. 2A through FIG. 2C.

During the wafer sawing operation, a wafer saw blade 3014 cuts through the scribeline region 3004 to form a saw kerf 3016. The saw kerf 3016 has rough sidewalls from which cracks may initiate in the dielectric layers 3018 in the scribeline region 3004. Cracks are especially prone to propagate through dielectric layers under tensile stress, which commonly exists in low-k dielectrics in integrated circuits. Configuring exterior surfaces 3020 of the crack deflecting structure 3008 and the optional second crack deflecting structure 3010, if present, such that metal lines do not overhang continuous vias, and such that at least half of continuous vias are recessed from edges of underlying continuous metal lines is advantageous because cracks propagating from the kerf sidewalls may be deflected upward to a top surface of the scribeline region 3004, rather than through the scribe seal 3006 and into the integrated circuit 3000.

Including the optional chemical impurity barrier structure 3012, if present, in the scribe seal 3006 is advantageous because it provides further protection from chemical impurities which may diffuse from the saw kerf 3016 through the dielectric layers 3018 in the scribeline region 3004 into the integrated circuit 3000. Continuous contacts, continuous metal lines and continuous vias in the crack deflecting structure 3008, the optional second crack deflecting structure 3010, if present, and the optional chemical impurity barrier structure 3012, if present, advantageously provide diffusion barriers to the chemical impurities.

Figure 4:
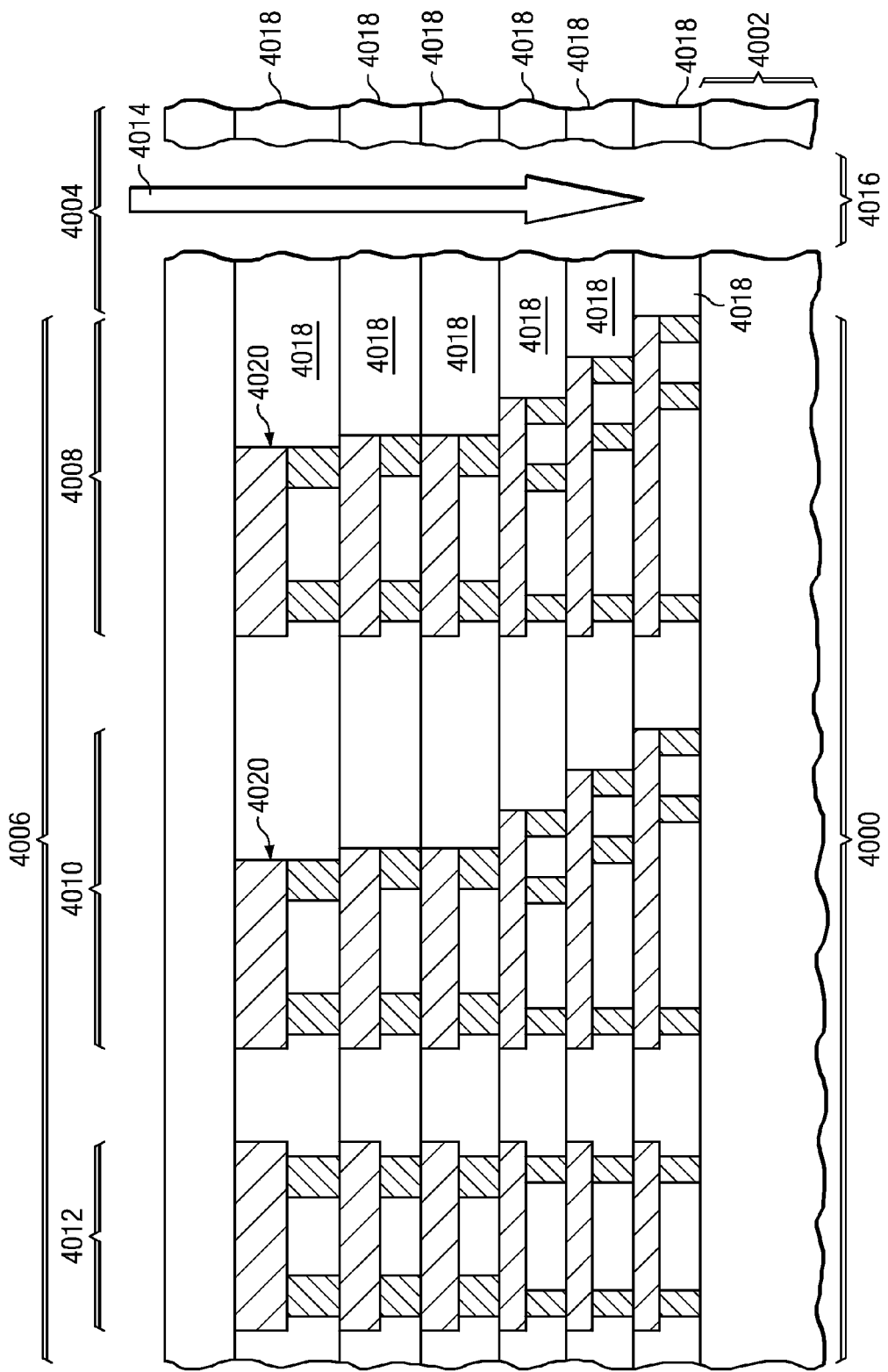
FIG. 4 depicts an integrated circuit formed according to an embodiment of the instant invention, during a laser ablation scribing operation.

FIG. 4 depicts an integrated circuit formed according to an embodiment of the instant invention, during a laser ablation scribing operation. The integrated circuit 4000 is formed on a substrate 4002 as described in reference to FIG. 1A. A scribeline region 4004 is adjacent to the integrated circuit 4000. A scribe seal 4006 includes a crack deflecting structure 4008, formed as described in reference to FIG. 1A through FIG. 1D or as described in reference to FIG. 2A through FIG. 2C. The scribe seal 4006 may include an optional second crack deflecting structure 4010, formed concurrently with the crack deflecting structure 4008, as described in reference to FIG. 1A through FIG. 1D or as described in reference to FIG. 2A through FIG. 2C. The scribe seal 4006 may further include an optional chemical impurity barrier structure 4012, also formed concurrently with the crack deflecting structure 4008, as described in reference to FIG. 1A through FIG. 1D or as described in reference to FIG. 2A through FIG. 2C.

During the laser ablation scribing operation, a laser beam, depicted schematically in FIG. 4 by an arrow 4014, is focused on the scribeline region 4004 and removes material from the scribeline region 4004 to cut through the scribeline region 4004 to form a laser kerf 4016. The laser kerf 4016 has rough sidewalls from which cracks may initiate in the dielectric layers 4018 in the scribeline region 4004. As explained in reference to FIG. 3, cracks are commonly prone to propagate through dielectric layers under tensile stress. Configuring exterior surfaces 4020 of the crack deflecting structure 4008 and the optional second crack deflecting structure 4010, if present, such that metal lines do not overhang continuous vias, and such that at least half of continuous vias are recessed from edges of underlying continuous metal lines is advantageous because cracks propagating from the kerf sidewalls may be deflected upward to a top surface of the scribe region 4004, rather than through the scribe seal 4006 and into the integrated circuit 4000.

Including the optional chemical impurity barrier structure 4012, if present, in the scribe seal 4006 is advantageous because it provides further protection from chemical impurities which may diffuse from the laser kerf 4016 through the dielectric layers 4018 in the scribeline region 4004 into the integrated circuit 4000. Continuous contacts, continuous metal lines and continuous vias in the crack deflecting structure 4008, the optional second crack deflecting structure 4010, if present, and the optional chemical impurity barrier structure 4012, if present, advantageously provide diffusion barriers to the chemical impurities.

Figure 5:
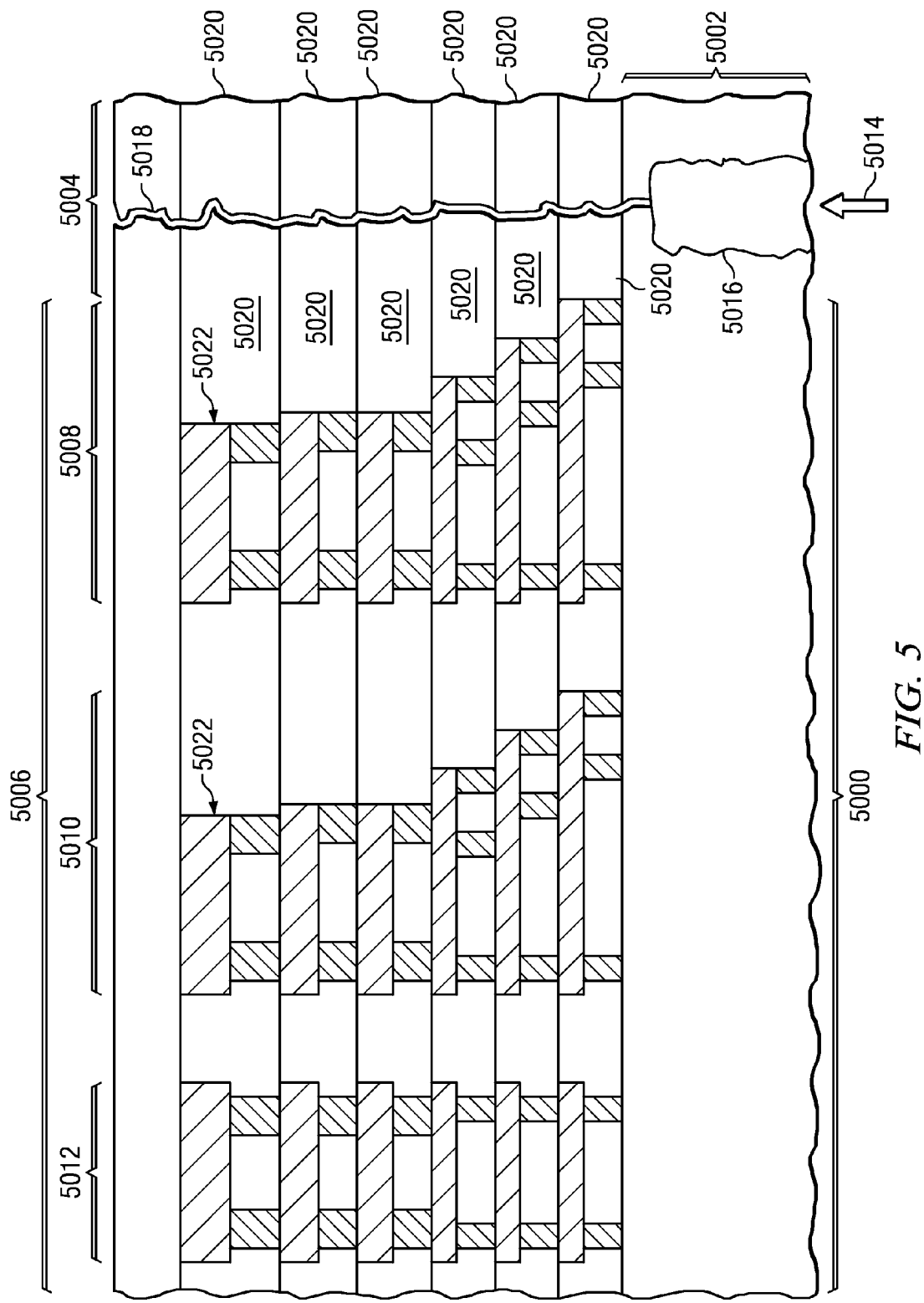
FIG. 5 depicts an integrated circuit formed according to an embodiment of the instant invention, during a damage creating laser scribing operation.

FIG. 5 depicts an integrated circuit formed according to an embodiment of the instant invention, during a damage creating laser scribing operation. The integrated circuit 5000 is formed on a substrate 5002 as described in reference to FIG. 1A. A scribeline region 5004 is adjacent to the integrated circuit 5000. A scribe seal 5006 includes a crack deflecting structure 5008, formed as described in reference to FIG. 1A through FIG. 1D or as described in reference to FIG. 2A through FIG. 2C. The scribe seal 5006 may include an optional second crack deflecting structure 5010, formed concurrently with the crack deflecting structure 5008, as described in reference to FIG. 1A through FIG. 1D or as described in reference to FIG. 2A through FIG. 2C. The scribe seal 5006 may further include an optional chemical impurity barrier structure 5012, also formed concurrently with the crack deflecting structure 5008, as described in reference to FIG. 1A through FIG. 1D or as described in reference to FIG. 2A through FIG. 2C.

During the damage creating laser scribing operation, a damage creating laser beam, depicted schematically in FIG. 5 by an arrow 5014, is focused on the scribeline region 5004 from a top direction or a bottom direction as depicted in FIG. 5, and creates structural damage 5016 in the substrate 5002 in the scribeline region 5004. The substrate 5002 is subsequently cleaved at the structural damage 5016 through dielectric layers 5020 in the scribeline region 5004 to separate the integrated circuit 5000 from a remainder of the substrate 5002. A cleave line 5018 in the scribeline region 5004 has rough sidewalls from which cracks may initiate in the dielectric layers 5020 in the scribeline region 5004. As explained in reference to FIG. 3, cracks are commonly prone to propagate through dielectric layers under tensile stress. Configuring exterior surfaces 5022 of the crack deflecting structure 5008 and the optional second crack deflecting structure 5010, if present, such that metal lines do not overhang continuous vias, and such that at least half of continuous vias are recessed from edges of underlying continuous metal lines is advantageous because cracks propagating from the cleave line sidewalls may be deflected upward to a top surface of the scribeline region 5004, rather than through the scribe seal 5006 and into the integrated circuit 5000.

Including the optional chemical impurity barrier structure 5012, if present, in the scribe seal 5006 is advantageous because it provides further protection from chemical impurities which may diffuse from the cleave line 5018 through the dielectric layers 5020 in the scribeline region 5004 into the integrated circuit 5000. Continuous contacts, continuous metal lines and continuous vias in the crack deflecting structure 5008, the optional second crack deflecting structure 5010, if present, and the optional chemical impurity barrier structure 5012, if present, advantageously provide diffusion barriers to the chemical impurities.

What is claimed is:

1. A process of forming an integrated circuit, comprising the steps of:
   providing a substrate, said substrate including a scribeline region adjacent to an area defined for said integrated circuit;
   forming a pre-metal dielectric (PMD) layer on a top surface of said substrate;
   forming a continuous contact in said PMD layer in a region defined for a crack deflecting structure, said crack deflecting structure region being located at a perimeter of said integrated circuit adjacent to said scribeline region, and such that said continuous contact directly connects to said substrate;

forming a first IMD layer on a top surface of said PMD layer;

forming a continuous first metal line in said first IMD layer in said crack deflecting structure region, such that said continuous first metal line connects to said continuous contact and does not overhang an exterior edge of said continuous contact, wherein said exterior edge is an edge nearest the scribeline region;

forming a first ILD layer on a top surface of said first IMD layer;

forming a continuous first via in said first ILD layer in said crack deflecting structure region, such that said continuous first via connects to said continuous first metal line;

forming a continuous second metal line in said first ILD layer in said crack deflecting structure region, such that said continuous second metal line connects to said continuous first via and does not overhang an exterior edge nearest the scribeline region of said continuous first via;

forming a second ILD layer on a top surface of said first ILD layer;

forming a continuous second via in said second ILD layer in said crack deflecting structure region, such that said continuous second via connects to said continuous second metal line; and forming a continuous third metal line in said second ILD layer in said crack deflecting structure region, such that said continuous third metal line connects to said continuous second via and does not overhang an exterior edge nearest the scribeline region of said continuous second via;

such that at least one of the following conditions exists:
  said continuous first via is recessed from an exterior edge nearest the scribeline region of said continuous first metal line; and
  said continuous second via is recessed from an exterior edge nearest the scribeline region of said continuous second metal line.

2. The process of claim 1, further including the steps of:
forming a third ILD layer on a top surface of said second ILD layer;
forming a continuous third via in said third ILD layer in said crack deflecting structure region, such that said continuous third via connects to said continuous third metal line, and such that said continuous third via is recessed from an exterior edge nearest the scribeline region of said continuous third metal line; and
forming a continuous fourth metal line in said third ILD layer in said crack deflecting structure region, such that said continuous fourth metal line connects to said continuous third via and does not overhang an exterior edge nearest the scribeline region of said continuous third via.

3. The process of claim 2, in which
said continuous first via is recessed from said exterior edge nearest the scribeline region of said continuous first metal line; and
said continuous second via is recessed from said exterior edge nearest the scribeline region of said continuous second metal line.

4. The process of claim 1, further including the steps of:
forming a secondary contact in said PMD layer in said crack deflecting structure region behind said first continuous contact, such that said secondary contact directly connects to said substrate and connects to said continuous first metal line;
forming a secondary first via in said first ILD layer in said crack deflecting structure region behind said first continuous first via, such that said secondary first via connects to said continuous first metal line and connects to said continuous second metal line; and
forming a secondary second via in said second ILD layer in said crack deflecting structure region behind said first continuous second via, such that said secondary second via connects to said continuous second metal line and connects to said continuous third metal line.

5. The process of claim 1, in which said crack deflecting structure is a first crack deflecting structure, and further including the steps of:
forming a second continuous contact in said PMD layer in a region defined for a second crack deflecting structure, said second crack deflecting structure region being located between said first crack deflecting structure and said area defined for said integrated circuit, and such that said second continuous contact directly connects to said substrate;
forming a second continuous first metal line in said first IMD layer in said second crack deflecting structure region, such that said second continuous first metal line connects to said second continuous contact and does not overhang an exterior edge nearest the scribeline region of said second continuous contact;
forming a second continuous first via in said first ILD layer in said second crack deflecting structure region, such that said second continuous first via connects to said second continuous first metal line;
forming a second continuous second metal line in said first ILD layer in said second crack deflecting structure region, such that said second continuous second metal line connects to said second continuous first via and does not overhang an exterior edge nearest the scribeline region of said second continuous first via;
forming a second continuous second via in said second ILD layer in said second crack deflecting structure region, such that said second continuous second via connects to said second continuous second metal line; and
forming a second continuous third metal line in said second ILD layer in said second crack deflecting structure region, such that said second continuous third metal line connects to said second continuous second via and does not overhang an exterior edge nearest the scribeline region of said second continuous second via;
such that at least one of the following conditions exists:
  said second continuous first via is recessed from an exterior edge nearest the scribeline region of said second continuous first metal line; and
  said second continuous second via is recessed from an exterior edge nearest the scribeline region of said second continuous second metal line.

6. The process of claim 5, in which said secondary contact is a continuous secondary contact, said secondary first via is a continuous secondary first via, and said secondary second via is a continuous secondary second via.

7. The process of claim 1, wherein:
said continuous first metal line includes copper;
said continuous first via includes copper;
said continuous second metal line includes copper;
said continuous first via and said continuous second metal line are formed by a dual damascene copper process;
said continuous second via includes copper;
said continuous third metal line includes copper; and
said continuous second via and said continuous third metal line are formed by a dual damascene copper process.

8. The process of claim 1, wherein:
said continuous first metal line includes aluminum;

said continuous first via includes aluminum;
said continuous second metal line includes aluminum;
said continuous second via includes aluminum;
said continuous third metal line includes aluminum.

9. The process of claim 1, further including the step of cutting through said scribeline region using a wafer saw.

10. The process of claim 1, further including the step of cutting through said scribeline region using an ablation laser.

11. The process of claim 1, further including the steps of:
   creating material damage in said substrate in said scribeline region using a damage creating laser; and
   cleaving said substrate through said material damage in said scribeline region.

12. A process of forming an integrated circuit, comprising the steps of:
   providing a substrate, said substrate including a scribeline region adjacent to an area defined for said integrated circuit;
   forming a pre-metal dielectric (PMD) layer on a top surface of said substrate;
   forming a continuous contact in said PMD layer in a region defined for a crack deflecting structure, said crack deflecting structure region being located at a perimeter of said integrated circuit adjacent to said scribeline region, and such that said continuous contact directly connects to said substrate;
   forming a first IMD layer on a top surface of said PMD layer;
   forming a continuous first metal line in said first IMD layer in said crack deflecting structure region, such that said continuous first metal line connects to said continuous contact and does not overhang an exterior edge of said continuous contact;
   forming a first ILD layer on a top surface of said first IMD layer;
   forming a continuous first via in said first ILD layer in said crack deflecting structure region, such that said continuous first via connects to said continuous first metal line;
   forming a continuous second metal line in said first ILD layer in said crack deflecting structure region, such that said continuous second metal line connects to said continuous first via and does not overhang an exterior edge of said continuous first via;
   forming a second ILD layer on a top surface of said first ILD layer;
   forming a continuous second via in said second ILD layer in said crack deflecting structure region, such that said continuous second via connects to said continuous second metal line; and
   forming a continuous third metal line in said second ILD layer in said crack deflecting structure region, such that said continuous third metal line connects to said continuous second via and does not overhang an exterior edge of said continuous second via;
   such that at least one of the following conditions exists:
      said continuous first via is recessed from an exterior edge of said continuous first metal line; and
      said continuous second via is recessed from an exterior edge of said continuous second metal line;
   forming a second continuous contact in said PMD layer in a region defined for a second crack deflecting structure, said second crack deflecting structure region being located between said first crack deflecting structure and said area defined for said integrated circuit, and such that said second continuous contact directly connects to said substrate;
   forming a second continuous first metal line in said first IMD layer in said second crack deflecting structure region, such that said second continuous first metal line connects to said second continuous contact and does not overhang an exterior edge of said second continuous contact;
   forming a second continuous first via in said first ILD layer in said second crack deflecting structure region, such that said second continuous first via connects to said second continuous first metal line;
   forming a second continuous second metal line in said first ILD layer in said second crack deflecting structure region, such that said second continuous second metal line connects to said second continuous first via and does not overhang an exterior edge of said second continuous first via;
   forming a second continuous second via in said second ILD layer in said second crack deflecting structure region, such that said second continuous second via connects to said second continuous second metal line; and
   forming a second continuous third metal line in said second ILD layer in said second crack deflecting structure region, such that said second continuous third metal line connects to said second continuous second via and does not overhang an exterior edge of said second continuous second via;
   such that at least one of the following conditions exists:
      said second continuous first via is recessed from an exterior edge of said second continuous first metal line; and
      said second continuous second via is recessed from an exterior edge of said second continuous second metal line;
   forming a third continuous contact in said PMD layer in a region defined for a chemical impurity barrier structure, said chemical impurity barrier structure region being located on between said second crack deflecting structure and said area defined for said integrated circuit, and such that said third continuous contact directly connects to said substrate;
   forming a third continuous first metal line in said first IMD layer in said chemical impurity barrier region, such that said third continuous first metal line connects to said third continuous contact
   forming a third continuous first via in said first ILD layer in said chemical impurity barrier region, such that said third continuous first via connects to said third continuous first metal line;
   forming a third continuous second metal line in said first ILD layer in said chemical impurity barrier region, such that said third continuous second metal line connects to said third continuous first via;
   forming a third continuous second via in said second ILD layer in said chemical impurity barrier, such that said third continuous second via connects to said third continuous second metal line; and
   forming a third continuous third metal line in said second ILD layer in said chemical impurity barrier region, such that said third continuous third metal line connects to said third continuous second via.

* * * * *